US012763742B2

(12) United States Patent
Ellwood et al.

(10) Patent No.: US 12,763,742 B2
(45) Date of Patent: Oct. 13, 2026

(54) INCREASING DIGITAL POWER AMPLIFIER EFFICIENCY BY REUSING DRIVER CURRENT

(71) Applicant: RENESAS DESIGN AUSTRIA GMBH, Graz (AT)

(72) Inventors: Stephen Ellwood, Graz (AT); Lukas Niederwieser, Graz (AT)

(73) Assignee: RENESAS DESIGN AUSTRIA GMBH, Graz (AT)

( * ) Notice: Subject to any disclaimer, the term of this patent is extended or adjusted under 35 U.S.C. 154(b) by 397 days.

(21) Appl. No.: 18/694,110

(22) PCT Filed: Aug. 17, 2022

(86) PCT No.: PCT/EP2022/072950
§ 371 (c)(1),
(2) Date: Mar. 21, 2024

(87) PCT Pub. No.: WO2023/066546
PCT Pub. Date: Apr. 27, 2023

(65) Prior Publication Data

US 2024/0396512 A1 Nov. 28, 2024

(30) Foreign Application Priority Data

Oct. 20, 2021 (EP) .................................... 21203710

(51) Int. Cl.
*H03F 3/45* (2006.01)
*H03K 19/0175* (2006.01)

(52) U.S. Cl.
CPC . *H03F 3/45475* (2013.01); *H03K 19/017509* (2013.01); *H03F 2200/451* (2013.01)

(58) Field of Classification Search
CPC .......... H03F 3/45475; H03F 2200/451; H03K 19/017509
USPC .......................................... 327/108–112, 427
See application file for complete search history.

(56) References Cited

U.S. PATENT DOCUMENTS 8,547,177 B1 * 10/2013 Yoo ........................ H03F 3/211 330/51

OTHER PUBLICATIONS

International Search Report issued in the corresponding PCT Application PCT/EP2022/072950, Oct. 14, 2022.
Written Opinion issued in the corresponding PCT Application PCT/EP2022/072950, Oct. 14, 2022.

* cited by examiner

*Primary Examiner* — Tomi Skibinski
(74) *Attorney, Agent, or Firm* — Merchant & Gould P.C.

(57) ABSTRACT

A differential digital power amplifier to drive an RFID antenna with a sinusoidal output current with an RFID frequency which differential digital power amplifier comprises: a digital control section to output digital waveforming bits to a first group of driver blocks and a second group of driver blocks wherein a switch between the source contact of a first source follower transistor and the source contact of a second source follower transistor to short circuit these source contacts to unload/load gate-source capacitances of a drain extended PMOS transistors with charge carriers used to load/unload gate-source capacitances of the drain extended NMOS transistors to reduce the driver current needed at gate contacts of the drain extended PMOS transistors and drain extended NMOS transistors.

5 Claims, 4 Drawing Sheets

| | | w/o current reuse | w/ current reuse |
|---|---|---|---|
| PA @ 70°C | Pout | 2.057 W | 2.072 W |
| | Pin | 2.784 W | 2.745 W |
| | Efficiency | 73.88 % | 75.5 % |
| PMOS part | Loss SF | 36.38 mW | 37.05mW |
| | Loss driver | 47.70 mW | 47.98mW |
| | Total | 84.08 mW | 85.03 mW |
| NMOS part | Loss SF | 28.22 mW | 33.42 nW |
| | Loss driver | 20.53 mW | 57.23 nW |
| | Total | 48.75 mW | 90.65 nW |

28

Fig. 5

INCREASING DIGITAL POWER AMPLIFIER EFFICIENCY BY REUSING DRIVER CURRENT

This application is a National Stage Application of PCT/EP2022/072950, filed Aug. 17, 2022, which claims benefit of European Application No. 21203710.5, filed Oct. 20, 2021, in and which applications are incorporated herein by reference. To the extent appropriate, a claim of priority is made to each of the above disclosed applications.

FIELD OF THE INVENTION

The present invention relates to a differential digital power amplifier to drive an RFID antenna with a sinusoidal output current with an RFID frequency which differential digital power amplifier comprises:

a digital control section to output digital wave-forming bits to a first group of driver blocks and a second group of driver blocks wherein each group comprises a number of N parallel driver blocks, wherein each group of driver blocks provide one common output contact for the RFID antenna.

BACKGROUND OF THE INVENTION

Such a differential digital power amplifier is known from the patent EP 3 182 585 B1 of the applicant. Such a differential power amplifier may be used for wireless charging of small devices e.g. wearables using Near Field Communications. NFC antennas need to be driven at a high voltage, up to 70V peak. The Panthronics DIRAC PA driver claimed in above referenced patent is capable of doing this using a 5V differential power amplifier.

Implementing such a power amplifier topology in small geometry processes like a 40 nm semiconductor manufacturing process can only be achieved using MOS transistors featuring extended drains for 5V tolerance. In extended drain DMOS transistors, also called drain extended devices by some manufacturers, the maximum gate-source voltage is typically lower than the maximum drain-source voltage. However, for maximum utility the power amplifier must work from a single supply voltage e.g. a lithium Ion battery. In these cases, the designer is forced to create intermediate power supplies to drive the gates of the output transistors. These intermediate power supplies create a large drop in efficiency as power is lost in the internal pass devices used to create the intermediate voltage.

The above problem becomes worse in battery powered devices since the power amplifier voltage follows the battery terminal voltage. A DC-DC convertor can be used to create a constant output voltage from the variable battery voltage, but the DC-DC convertor itself is a source of efficiency loss.

U.S. Pat. No. 8,547,177 B1) discloses an all-digital switched-capacitor radio frequency power amplifier. Current of digitally switched driving stages and more specifically the charges are accumulated in a capacitor. The output of trumpet buffers are connected to gate contacts of NMOS and PMOS transistors to provide the current to be accumulated.

SUMMARY OF THE INVENTION

It is an object of the invention to provide a differential digital power amplifier extended drain MOS transistors to enable a small geometry semiconductor manufacturing process with improved efficiency and less power consumption.

This object is achieved in a system with a differential digital power amplifier according to claim 1.

This invention is based on the observation that typical drain extended MOS transistors have an RDSon, that is relatively constant at gate-source voltages above a certain voltage. For an example 40 nm manufacturing technology this could be 2.0V versus a maximum permissible gate-source voltage of 3.6V.

On the high side of the power amplifier is an extended drain PMOS transistor. To turn on this transistor, the gate voltage is lower than the source. For example, for a supply voltage, VDPA of, say, 5V. the gate of the PMOS transistor is driven to 3.0V or lower with respect to ground. On the low side of the power amplifier is an extended drain NMOS transistor, which is driven hard on when the gate voltage is higher than 2.0V with respect to its source contact, which is connected to ground.

When supply voltage VDPA=5.0V there is a 1.0V difference between the PMOS driver intermediate voltage (5-2.0=3.0V) and the NMOS driver (2.0V) intermediate supply voltages. By placing a switch between the high side driver voltage and the low side driver voltage a voltage divider is created whereby the [conventional] current (charge carriers of the gate-source capacitances of the drain extended MOS transistors) is first used by the high side driver and then reused by the low side driver. Since, for a given RDSon the area and therefore gate-source capacitance of a PMOS transistor is higher than the gate-source capacitance of a NMOS transistor for the same RDSON, not all current is reused, but the current supplied by the low side regulator is reduced to zero increasing the overall pre-driver efficiency by 30%.

Furthermore, in typical digital power amplifier structures using extended drain MOS transistors separate pre-driver stages powered by voltage regulators are required to ensure that gate-source voltages of the output devices can be kept below the maximum allowed gate-source voltage. In a 2 W power amplifier utilizing extended drain MOS transistors sized for an RDSon of 0.1Ω the high side driver typically takes 42 mA when charging and discharging the extended drain PMOS gate capacitance at the RFID frequency of 13.56 MHz, which is the frequency required for an NFC power amplifier. The NMOS transistor driver typically consumes 22 mA in the same conditions. This represents a total pre-driver current of 64 mA. In the topology of the inventive differential digital power amplifier the driver current is reused in the NMOS driver. This results in a total driver current of 42 mA, representing a saving of more than 30%.

These and other aspects of the invention will be apparent from and elucidated with reference to the embodiments described hereinafter. The person skilled in the art will understand that various embodiments may be combined.

BRIEF DESCRIPTION OF THE DRAWINGS

FIG. 5 shows a simulation results of the differential digital power amplifier according to FIG. 1.

DETAILED DESCRIPTION OF EMBODIMENTS

Figure 1:
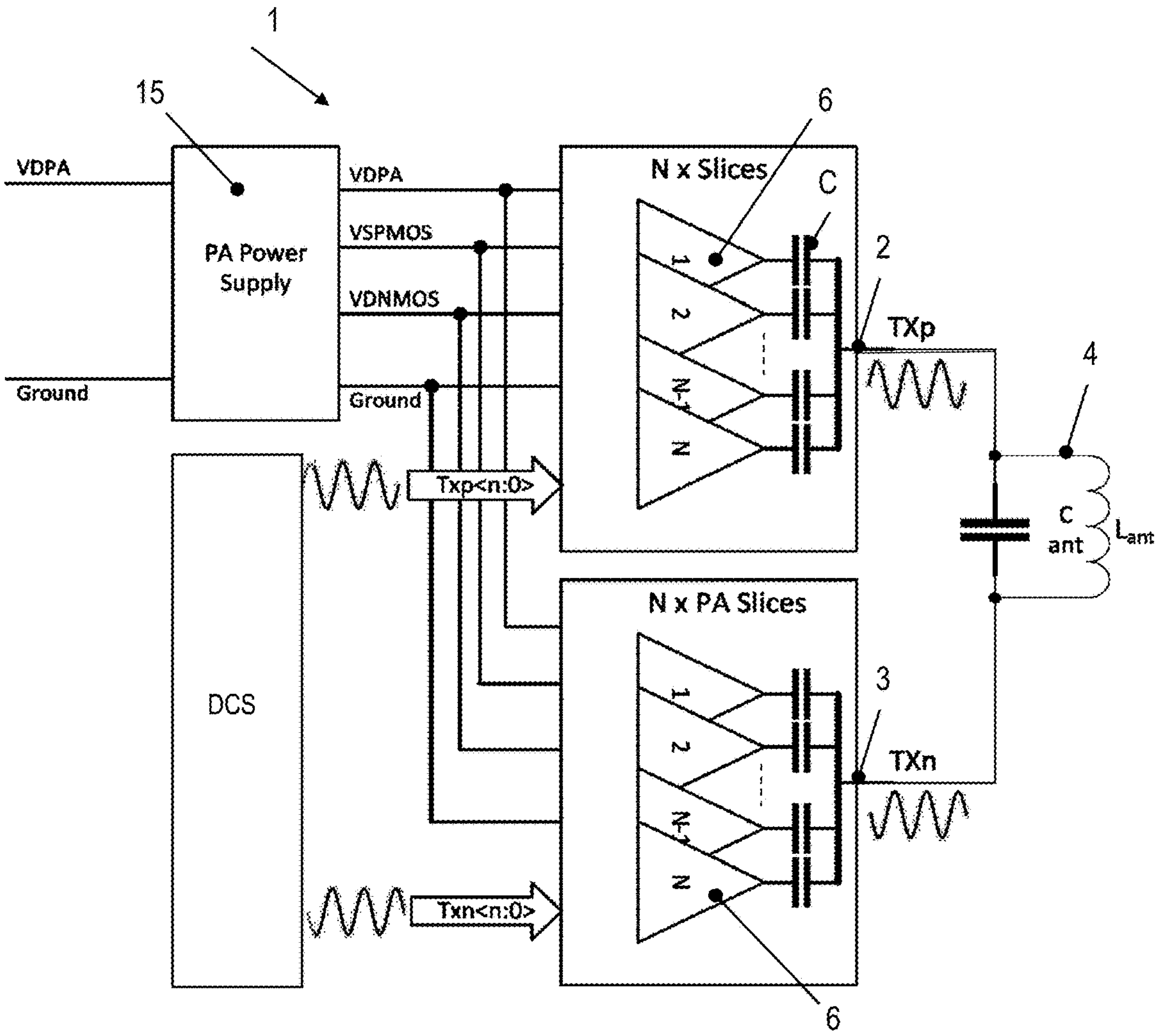
FIG. 1 shows a differential digital power amplifier according to a first embodiment of the invention.

FIG. 1 shows a first embodiment of a differential digital power amplifier 1 according to a first embodiment of the invention, which is named power amplifier 1 in the following description and which has been manufactured on a 40 nm process technology. The power amplifier 1 is connected with a first output contact 2 and a second output contact 3 built to drive an RFID antenna 4 with a sinusoidal output current with an RFID frequency of 13.56 MHz. The power amplifier 1 realizes a fully digital switched mode direct synthesis architecture capable of generating pure sin wave output. The architecture is fully differential, which doubles the voltage swing in the RFID antenna 4 compared to the supply voltage VDPA of 5 V in this embodiment. Hence, from 5V the power amplifier 1 produces 10 Vp/p differential into the RFID antenna 4. The power amplifier 1 is connected to the RFID antenna 4 using a typical H bridge configuration. This is important in the context of this invention since the differential configuration means that drain extended NDMOS transistors 5 of driver blocks 6 conduct at the same time as drain extended PDMOS transistors 7 of driver blocks 6, which driver blocks 6 are connected either to the first output contact 2 or to the second output contact 3 as will be explained below.

The power amplifier 1 comprises a digital control section DCS to output digital wave-forming bits to a first group of driver blocks 6 connected to the first output contact 2 and a second group of driver blocks 6 connected to the second output contact 3. The digital wave-forming bits switch either the driver block 6 on or off what adds increments of for instance 5 mA for the first or second output contact and enables to provide a smooth sinusoidal output current as described in EP 3 182 585 B1. Each group of driver blocks 6 comprises a number of N parallel driver blocks 6, wherein each group of driver blocks 6 provide one common output contact for the RFID antenna 4.

Figure 2:
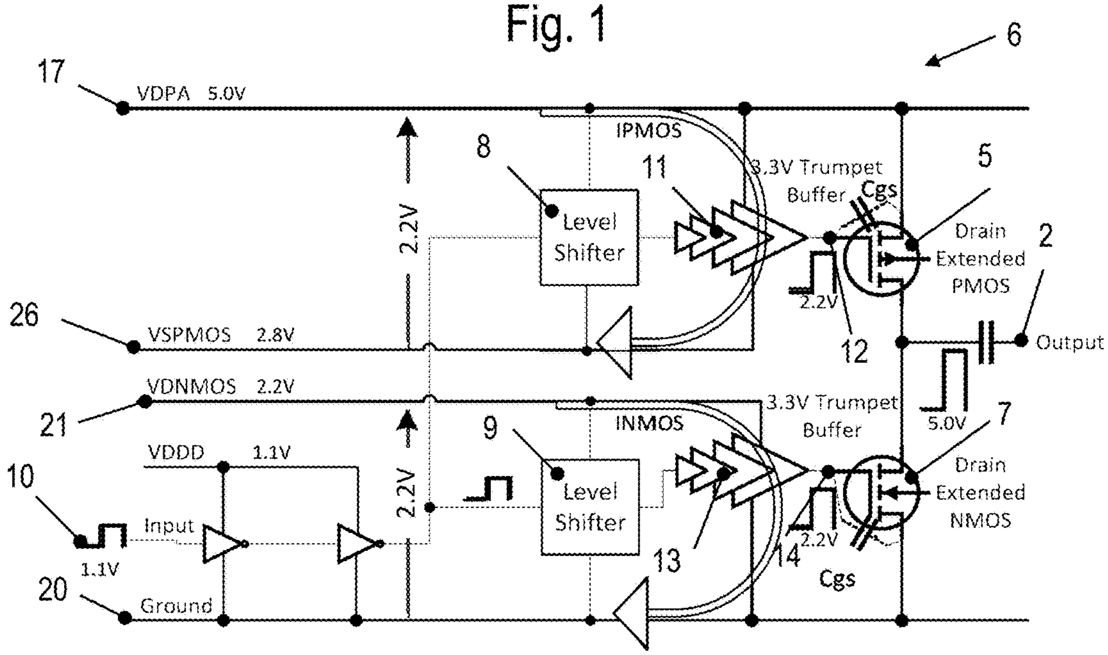
FIG. 2 shows a driver block of the differential digital power amplifier according to FIG. 1.

FIG. 2 shows one of the number of 2×N driver blocks 6 in detail, which driver block 6 comprises a first level shifter 8 and a second level shifter 9, to shift the voltage of 1.1 V of the wave-forming bit 10 provided by the digital control section DCS. Driver block 6 furthermore comprises a first trumpet buffer 11 connected to the output of the first level shifter 8, to provide at an output of the first trumpet buffer 11 a driver current with the RFID frequency of 13.56 MHz needed at a gate contact 12 of the drain extended PMOS transistor 5 to load/unload a gate-source capacitance of the drain extended PMOS transistor 5. A second trumpet buffer 13 connected to the output of the second level shifter 9, to provide at an output of the second trumpet buffer 13 the driver current with the RFID frequency needed at a gate contact 14 of a drain extended NMOS transistor 7 to load/unload a gate-source capacitance of the drain extended NMOS transistor 7. The drain extended 5V tolerant MOS transistors 5 and 7 are very large devices and have significant input capacitance, Cgs as shown in the FIG. 2. These capacitors must be charged/discharged at the rate of the NFC carrier frequency, 13.56 MHz by the trumpet buffers 11 and 13, consisting of a chain of buffers with increasing drive strength. The final stage of the trumpet buffers 11 and 13 is sufficiently large to drive the capacitance Cgs of the drain extended PMOS transistor 5 and the drain extended NMOS transistor 7 quickly enough for proper operation of the power amplifier 1.

Figure 3:
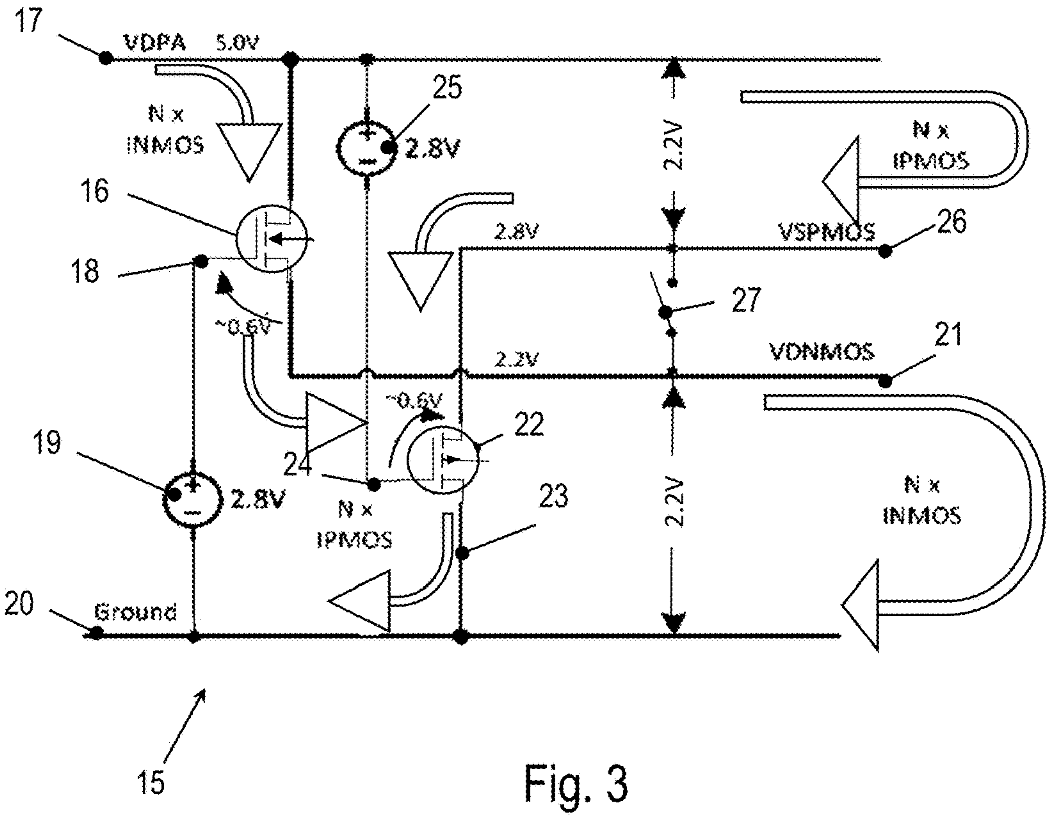
FIG. 3 shows a power supply of the differential digital power amplifier according to FIG. 1 when the switch is open.
Figure 4:
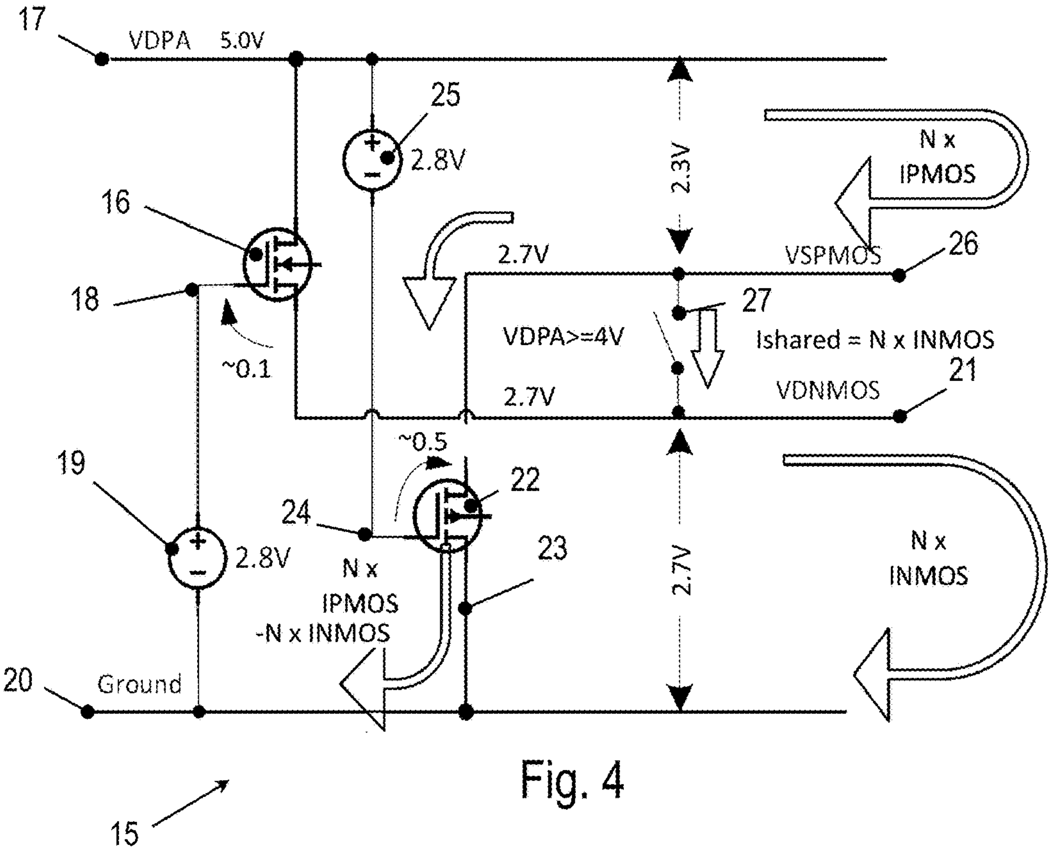
FIG. 4 shows a power supply of the differential digital power amplifier according to FIG. 1 when the switch is closed.

The power for all of the driver blocks 6 comes from an internal power supply 15 shown in FIGS. 3 and 4. The internal power supply 15 comprises a first source follower transistor 16, with its drain contact connected to a power supply contact 17 with the power supply of 5V and its gate contact 18 connected via a first voltage source 19 to a ground contact 20 of the supply voltage VDPA, which first source follower transistor 16 provides at its source contact 21 a second trumpet buffer supply voltage VDNMOS to supply the second trumpet buffers 13 of the driver blocks 6 with power. In this embodiment the first voltage source 19 is fixed with a voltage of 2.8V. The internal power supply 15 furthermore comprises a second source follower transistor 22 with its drain contact 23 connected to the ground contact 20 of the supply voltage VDPA and its gate contact 24 connected via a second voltage source 25 to the supply voltage contact 17, which second source follower transistor 22 provides at its source contact 26 a first trumped buffer supply voltage VSPMOS to supply the first trumpet buffers 11 of the driver blocks 6 with power.

The internal power supply 15 furthermore as inventive element comprises a switch 27 between the source contact 21 of the first source follower transistor 16 and the source contact 26 of the second source follower transistor 22. This switch 27 is shown in FIG. 3 in its open state and in FIG. 4 in its closed state. The switch 27 is built to switch (open and close) to short circuit these source contacts 21 and 26 to unload/load the gate-source capacitances Cgs of the drain extended PMOS transistors 5 with charge carriers used to load/unload the gate-source capacitances Cgs of the drain extended NMOS transistors 7 to reduce the driver current needed at the gate contacts 12 and 14. This has the advantage that part of the electrons/charge carriers to load or unload the gate-source capacitances Cgs are re-used what increases the efficiency and reduces the power consumption of the power amplifier 1.

The following description provides a concrete example of voltages how the internal power supply 15 is realized to work. The pair of source follower transistors 16 and 22 are wired as a feed-forward LDO. The source follower transistors 16 and 22 are so called, because the source voltage follows the gate voltage minus the Vgs, which varies, typically between 0.4V and 0.8V depending upon the channel current. It is difficult to create a feedback based LDO given the frequency of operation and impracticality of adding sufficient available on-chip capacitance. With no output capacitance to smooth the load, the voltage at the output of the source follower is not constant. To ensure at least 2.0V drive on the driver blocks 6 of the power amplifier 1 the nominal VDNMOS voltage at source contact 21 and VDPA−VSPMOIS voltage on source contact 26 are set to 2.2V.

The source follower transistors 16 and 22 are the main sources of loss that this invention is designed to address. These source followers carry the total driver current, N*INMOS through the first source follower transistor 16 and N*IPMOS through the second source follower transistor 22 where N is the total number of driver blocks 6. Both source follower transistors 16 and 22 have a voltage across them equal to VDPA−2.2V=2.8V when supply voltage VDPA is 5V. The power generated in these source follower transistors 22 and 16 is 2.8V*N*IPMOS=2.8V*42 mA=0.117 W and 2.8*N*INMOS=2.8V*22 mA=0.062 W for the source follower transistors 22 and 16 respectively when supply voltage VDPA is 5.0V.

In this invention a bypass switch 27 is implemented to reduce the losses in the internal power supply 15. This central switch 27 creates a low impedance path between the P side driver supply and the N side driver supply and, when closed, carries a current, Ishared shown in FIG. 4, which results from charge carriers of the gate-source capacitances Cgs when the drain extended PMOS transistors 5 are loaded/unloaded and the drain extended NMOS transistors 7 are unloaded/loaded. When closed, conventional current flows from supply voltage VDPA into the first trumpet buffer 11 of the driver block 6 which is switching its output drain extended PMOS transistor 5. The current returns to the internal power supply 15 via the source contact 26. It then passes through the switch 27 and out again on source contact 21 where it is used by the second trumpet buffer 13 on the opposite side of the driver block 6 to charge the gate of the drain extended NMOS transistor 7. In the opposite phase the charge carriers on both gate-source capacitances Cgs are returned to ground contact 20 using the same mechanism. Given the H bridge of the RFID antenna 4 connection, at any point in the cycle two transistors are driven to a low impedance and the other two to a high impedance by charging and discharging the gate-source capacitance respectively.

For simplicity, consider the situation when supply voltage VDPA=4.4V. In this situation VDNMOS=VSPMOS=2.2V above ground. Since IPMOS is 42 mA and INMOS is 22 mA, IShared becomes 22 mA since this is the lowest impedance path back to ground. The first source follower transistor 16 sources no current, and the second source follower transistor 22 supplies the difference or 20 mA. The total current is now 42 mA. At supply voltage VDPA=5V (FIG. 4) the voltage across the high side driver raises a little to 2.3V, the VDNMOS becomes 2.7V and the associated source follower remains out of circuit. In practice, due to the voltage variation on the feed-forward LDO output voltage (see FIG. 5, centre-left panel), it is advantageous to close the switch 27 for supply voltages VDPA voltages higher than a minimum voltage of 4V.

When supply voltage VDPA is lower than 4.0V the switch 27 could carry current in the opposite direction and lower the efficiency and must therefore be turned off. The control circuit for this switch 27, not shown in the figures, can be an analog voltage sensing circuit or can be a microcontroller which measures supply voltage VDPA and drives the switch 27 closed when supply voltage VDPA is above 4.0V.

For simplicity the switch 27 could be replaced with a passive diode or an active diode. This would remove the need for a voltage sensing circuit, but the Vd of the switch 27 would mean that this circuit would only be beneficial when voltage supply VDPA>=5V. This would be suitable for fixed voltage systems where voltage supply VDPA>=5V, but less suitable for battery powered devices.

With this current sharing topology as disclosed in the FIGS. 1 to 4 the typical 2 W DIRAC NFC power amplifier efficiency can be increased by 2.5% when supply voltage VDPA is high enough to close the bypass switch 27.

A table 28 shown if FIG. 5 shows the simulation results for supply voltage VDPA=5.5V at a junction temperature of 70° C. With the switch 27 is closed there is a small increase in power due to the increased gate drive on the output transistors. The efficiency of the power amplifier increases from 73.88% to 75.5%. This is mainly due to the NMOS part of the driver being reduces from 49 mW to almost zero (91 nW).

Figure 6:
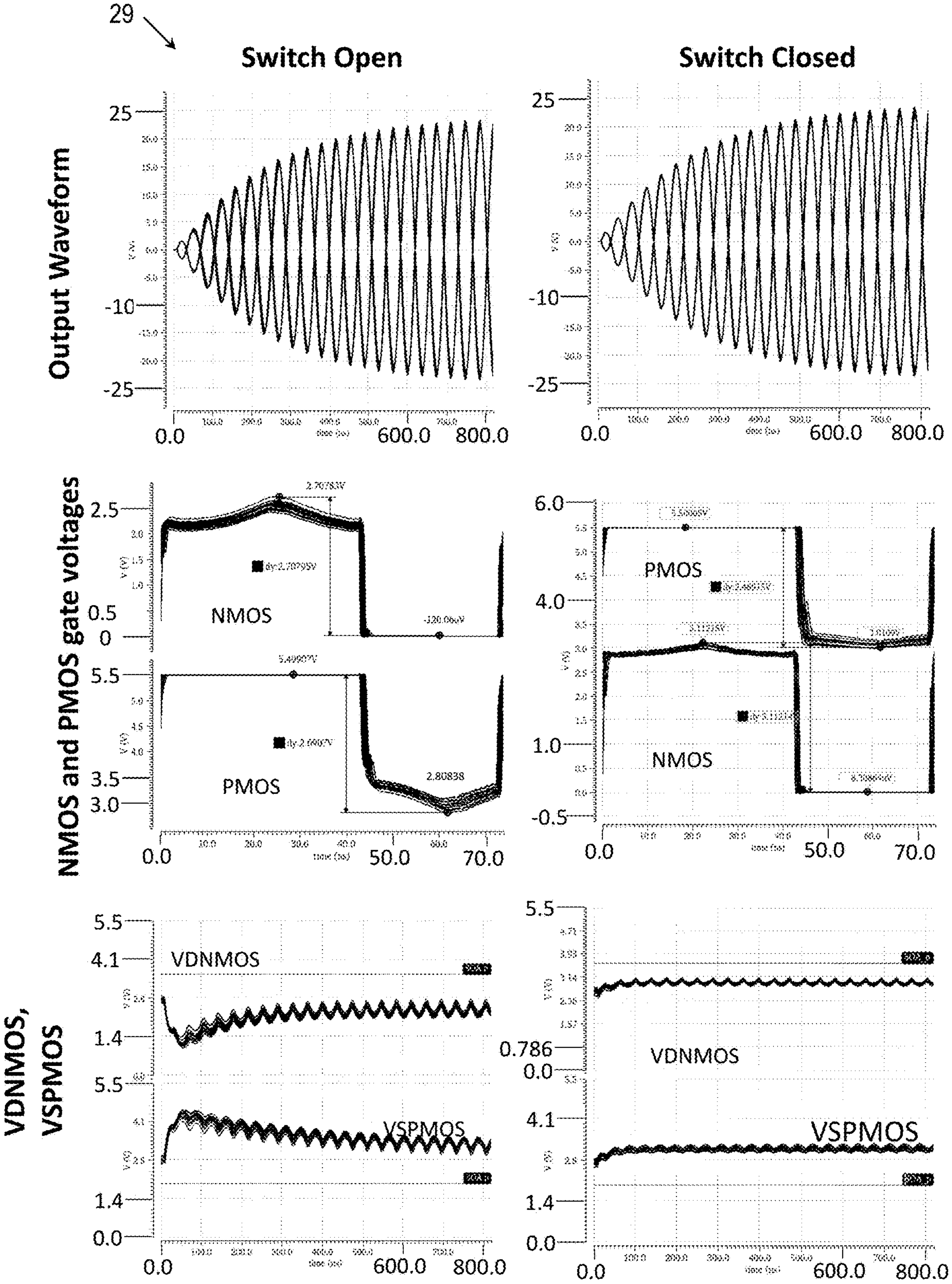
FIG. 6 shows a time diagrams of the simulations of the differential digital power amplifier according to FIG. 1.

Table 29 shown in FIG. 6 shows the relevant waveforms before and after the switch 27 is closed, representing the state of the art and the inventive power amplifier 1. As expected, there is almost no difference in the output waveform but VDNMOS increases to be equal to VSPMOS, resulting in a higher Vgs on the drain extended NMOS transistors 7. As the Vgs of the source follower transistors 16 and 22 driving VDNMOS is now negative (2.8V-3.0V) the channel of this source follower is completely closed and nA are flowing through it. A third benefit of the design is that the ripple on both VDNMOS and VSPMOS is reduced by a factor of 2 due to the lowering of the impedance formed when the two supplies are shorted together and the lower current in the source follower supplying VSPMOS.

Voltages and levels used in the first embodiment of this inventions are only one example and may vary with the manufacturing technology used to manufacture the power amplifier.

The invention claimed is:

1. A differential digital power amplifier configured to drive an RFID antenna with a sinusoidal output current with an RFID frequency which differential digital power amplifier comprises:

a digital control section configured to output digital wave-forming bits to a first group of driver blocks and a second group of driver blocks wherein each group of the first and second group of driver blocks comprises a number of N parallel driver blocks, wherein each group of the first and second group of driver blocks is configured to provide one common output contact for the RFID antenna, wherein each driver block of the first and second group of driver blocks comprises:

a first level shifter and a second level shifter, configured to shift the voltage of a corresponding wave-forming bit of the digital wave-forming bits provided by the digital control section, and a first trumpet buffer connected to an output of the first level shifter, configured to provide at an output of the first trumpet buffer a driver current with the RFID frequency needed at a gate contact of a drain extended PMOS transistor configured to load/unload a gate-source capacitance of the drain extended PMOS transistor, and a second trumpet buffer connected to an output of the second level shifter, configured to provide at an output of the second trumpet buffer the driver current with the RFID frequency needed at a gate contact of a drain extended NMOS transistor configured to load/unload a gate-source capacitance of the drain extended NMOS transistor, and that the differential digital power amplifier comprises an internal power supply configured to provide the power for the driver block of the first and second group of driver blocks, which internal power supply comprises:

a first source follower transistor, with its drain contact connected to a supply voltage contact of a supply voltage and its gate contact (18) connected via a first voltage source to a ground contact of the supply voltage, which first source follower transistor is configured to provide at its source contact a second trumpet buffer supply voltage configured to supply the second trumpet buffers and the second level shifter of the driver blocks, and a second source follower transistor with its drain contact connected to the ground contact of the supply voltage and its gate contact connected via a second voltage source to the supply voltage contact of the supply voltage, which second source follower transistor is configured to provide at its source contact a first trumped buffer supply voltage configured to supply the first trumpet buffers and the first level shifters of the driver blocks, and a switch between the source contact of the first source follower transistor and the source contact of the second source follower transistor configured to short circuit these source contacts configured to unload/load the gate-source capacitances of the drain extended PMOS transistors of the driver blocks of the first and second group of driver blocks with charge carriers configured to be used to load/unload the gate-source capacitances of the drain extended NMOS transistors of the driver blocks of the first and second group of driver blocks configured to reduce the driver current needed at the gate contacts of said PMOS transistors and NMOS transistors, which switch is configured to be closed for supply voltages higher than a minimum voltage or a passive diode or an active diode between the source contact of the first source follower transistor and the source contact of the second source follower transistor configured to short circuit these source contacts configured to unload/load the gate-source capacitances of the drain extended PMOS transistors of the driver blocks of the first and second group of driver blocks with charge carriers configured to be used to load/unload the gate-source capacitances of the drain extended NMOS transistors of the driver blocks of the first and second group of driver blocks configured to reduce the driver current needed at the gate contacts of said PMOS transistors and NMOS transistors, if the supply voltage is higher than a second minimum voltage.

2. The differential digital power amplifier according to claim 1, wherein for each driver block, the drain contacts of the drain extended PMOS transistor and the drain extended NMOS transistor are connected to a first contact of an output capacitance of the driver block, which second contacts of the output capacitances of the number of N parallel driver blocks are the one common output contact for the RFID antenna.

3. The differential digital power amplifier according to claim 2, wherein for each driver block, the source contact of the drain extended PMOS transistor is connected to the supply voltage and that the source contact of the drain extended NMOS transistor is connected to the ground contact of the supply voltage.

4. The differential digital power amplifier according to claim 1, wherein the first source follower transistor and the second follower transistor are realized as MOS transistors.

5. The differential digital power amplifier according to claim 1, further comprising a battery connected to the supply voltage contact and the ground contact to power the differential digital power amplifier.

* * * * *